(12) United States Patent
Kelly et al.

(10) Patent No.: US 7,250,819 B2
(45) Date of Patent: Jul. 31, 2007

(54) INPUT TRACKING CURRENT MIRROR FOR A DIFFERENTIAL AMPLIFIER SYSTEM

(75) Inventors: Daniel F. Kelly, Andover, MA (US); Lawrence A. Singer, Burlington, MA (US)

(73) Assignee: Analog Devices, Inc., Norwood, MA (US)

( * ) Notice: Subject to any disclaimer, the term of this patent is extended or adjusted under 35 U.S.C. 154(b) by 106 days.

(21) Appl. No.: 11/304,326

(22) Filed: Dec. 15, 2005

(65) Prior Publication Data
US 2006/0132239 A1    Jun. 22, 2006

Related U.S. Application Data

(60) Provisional application No. 60/636,725, filed on Dec. 16, 2004.

(51) Int. Cl.
*H03F 3/45* (2006.01)
(52) U.S. Cl. .................. 330/257; 330/258; 330/260
(58) Field of Classification Search .............. 330/257, 330/258, 260
See application file for complete search history.

(56) References Cited

U.S. PATENT DOCUMENTS

| | | | | |
|---|---|---|---|---|
| 5,714,906 | A | * | 2/1998 | Motamed et al. ............ 327/563 |
| 6,891,433 | B2 | * | 5/2005 | Schrader ...................... 330/253 |
| 7,042,289 | B2 | * | 5/2006 | Hwang et al. ............... 330/253 |
| 7,049,889 | B2 | * | 5/2006 | Kalb ........................... 330/253 |

* cited by examiner

*Primary Examiner*—Patricia Nguyen
(74) *Attorney, Agent, or Firm*—Iandiorio & Teska

(57) ABSTRACT

An input tracking current mirror for a differential amplifier system includes a current mirror having an input leg and an output leg, a differential amplifier including a first set of at least two transconductance components, each having at least one input terminal for receiving input signals, the first set of at least two transconductance components having a first common node connected to the output leg which has a first voltage that is a function of the input signals, and a tracking circuit including a second set of at least two transconductance components each having at least one input terminal for receiving the input signals, the second set of at least two transconductance components, having a second common node connected to the input leg which has a second voltage that is a function of the input signals, the tracking circuit driving the second voltage on the input leg to track the first voltage on the output leg with variations in the input signals.

19 Claims, 10 Drawing Sheets

INPUT TRACKING CURRENT MIRROR FOR A DIFFERENTIAL AMPLIFIER SYSTEM

RELATED APPLICATIONS

This application claims priority of U.S. Provisional Application No. 60/636,725 field on Dec. 16, 2004 incorporated by reference herein.

FIELD OF THE INVENTION

This invention relates to an input tracking current mirror for a differential amplifier system.

BACKGROUND OF THE INVENTION

A typical conventional mirror bias system for a differential amplifier includes a differential amplifier responsive to input signals and a current mirror that includes a tail current device on the output leg and a current reference device on the input leg. However, when the common mode voltage applied at the inputs of the differential amplifier changes or a differential change in voltage is applied to the inputs, the voltage on the drain of the tail current device changes and will not match the voltage on the drain of the current reference device. The result is that the current in the tail current device on the output leg no longer matches the current in the current reference device on the input leg due to the finite output resistances associated with the tail current device and the current reference device.

An improved prior art mirror bias system for a differential pair similarly includes a differential amplifier and a current mirror but adds a cascode device to the input leg connected to the current reference device. The gate voltage of the cascode device is set to a fixed voltage, $V_{BIAS}$, that fixes the voltage on the drain of the current reference device to be equal to $V_{BIAS}-V_{GS}$. The cascode device is typically sized to run at the same current density as the transconductance components of the differential amplifier. When $V_{BIAS}$ is set equal to the common mode voltage of the differential amplifier the voltage on the drain of the current reference device approximately matches the voltage on the drain of the tail current device and the effect of mismatched current due to the finite output impedance of the current reference device and the tail current device is cancelled. The drawback of such a design is that the cascode device is designed to be biased for a predetermined fixed input common mode voltage. The design does not account for changes in the input common mode voltage or a differential change in voltage applied to the inputs of the differential amplifier.

SUMMARY OF THE INVENTION

It is therefore an object of this invention to provide an improved input tracking current mirror for a differential amplifier system.

It is a further object of this invention to provide such an input tracking current mirror for a differential amplifier system in which the voltage in the input leg tracks the voltage on the output leg with changes in the common mode voltage or with differential voltages applied at the inputs of the differential amplifier.

It is a further object of this invention to provide such an input tracking current mirror for a differential amplifier system which maintains virtually constant matching of the current in the input and output legs of the current mirror with changes in the common mode or with differential voltages applied at the inputs of the differential amplifier. The invention results from the realization that an improved input tracking current mirror for a differential amplifier system which tracks the voltage on the input leg of the current mirror to the voltage on the output leg when the common mode voltage changes or with differential voltages applied at the input terminals can be effected in one preferred embodiment by a differential amplifier with at least two transconductance components that have a first common node on the output leg that has a first voltage that is a function of the input signals applied to the differential amplifier, and a tracking circuit that includes at least two transconductance components that are responsive to the same or equivalent input signals as the differential amplifier and includes a second common node on the input leg that has a second voltage that is a function of the same input signals wherein the tracking circuit drives the second voltage on the second common node on the input leg of the current to track the first voltage on the first common node on the output leg of the current mirror resulting in the current in the input leg tracking the current in the output leg.

The subject invention, however, in other embodiments, need not achieve all these objectives and the claims hereof should not be limited to structures or methods capable of achieving these objectives.

This invention features an input tracking current mirror for a differential amplifier system including a current mirror having an input leg and an output leg, a differential amplifier including a first set of at least two transconductance components and a tracking circuit. Each transconductance component has at least one input terminal for receiving input signals. The first set of at least two transconductance components has a first common node connected to the output leg having a first voltage that is a function of the input signals. The tracking circuit includes a second set of at least two transconductance components, each having at least one input terminal for receiving the input signals. The second set of at least two transconductance components has a second common node connected to the input leg which has a second voltage that is a function of the input signals. The tracking circuit drives the second voltage on the input leg to trace the first voltage on the output leg with variations in the input signals.

In one embodiment, the first and second sets of at least two transconductance components may each include a transconductance device chosen from the group consisting of a MOSFET, a bipolar junction transistor, and a JFET. The MOSFET may include a PMOS type device or an NMOS type device. The bipolar junction transistor may include a PNP type device or an NPN type device. The input leg may include a feedback loop and the second set of at least two transconductance components of the tracking circuit may be connected inside the feedback loop. The feedback loop may include a biasing device for boosting the headroom of the tracking circuit. The biasing device may include a biasing device chosen from the group consisting of a battery, a switched capacitor, an operational amplifier, a buffer, and a follower for boosting the headroom of the tracking circuit. The first and second sets of at least two input terminals may further include at least a third input terminal for receiving at least a third input signal. The first and second sets of at least two transconductance components may each further include at least a third transconductance component for common mode biasing the differential pair and the tracking circuit. The first and second sets of transconductance components may each further include a component for tracking the common mode voltage of the input signals of the differential amplifier and the tracking circuit. The component may be chosen from the group consisting of a diode connected transistor, a resistor, and a current source.

This invention also features an input tracking current mirror system for a differential amplifier system including a first current mirror circuit having an input leg and an output leg, and a differential amplifier including a first set of at least two transconductance components. Each transconductance component has at least one input terminal for receiving input signals. The first set of at least two transconductance components has a first common node connected to the output leg which has a first voltage that is a function of the input signals. A first tracking circuit includes at least one first transconductance component having at least one input terminal for receiving one of the input signals. The at least one first transconductance component has a second node connected to the input leg which has a second voltage that is a function of the one of the input signals. The first tracking circuit drives the second voltage on the input leg to track the first voltage on the output leg.

In one embodiment, the system may further include a second tracking circuit and a second current mirror circuit including an input leg and an output leg wherein the output leg of the second current mirror circuit is connected to the output leg of the first current mirror by an output leg common node. The second tracking circuit may include at least one second transconductance component which has at least one input terminal for receiving the other of the input signals. The second transconductance component may have a third node connected to the input leg of the second current mirror which has a third voltage that is a function of the other of the input signals. The first and second tracking circuits drive the average of the second and third voltages on the input legs of the first and second current mirror circuits to track the voltage on the output leg common node. The sum of the current densities in the output legs may be constant and approximately equal to the sum of the current densities in the input legs. The input leg of the first current mirror may include a feedback loop. The at least one first transconductance component may be connected inside the feedback loop. The input leg of the second current mirror may include a feedback loop. The at least one second transconductance component may be connected inside the feedback loop. The feedback loop of the first current mirror may be shorted to the feedback loop of the second current mirror. The input leg of the first current mirror may be shorted to the input leg of the second current mirror.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
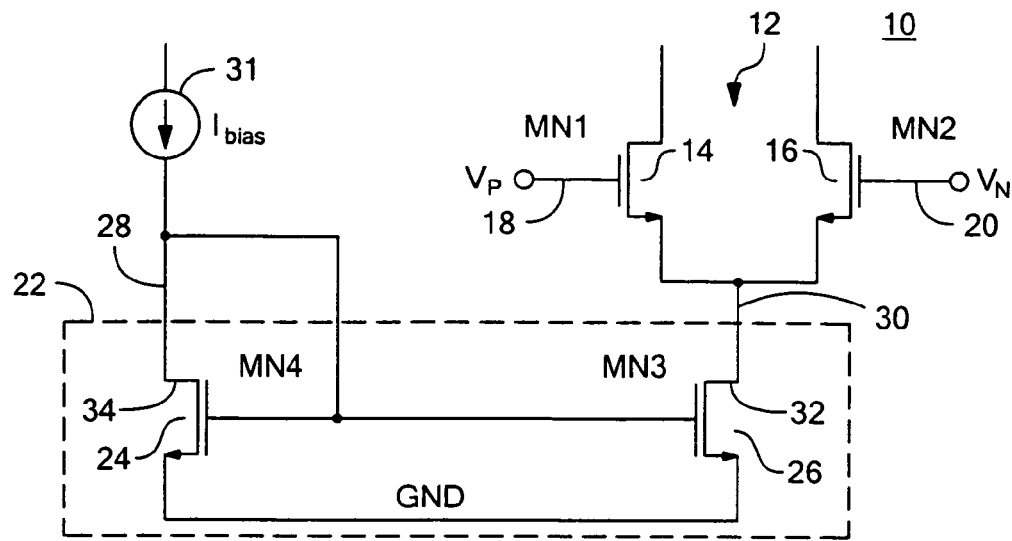
FIG. 1 is a circuit diagram of a typical prior art mirror bias system for a differential amplifier system.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the Background section above, conventional mirror bias system 10, FIG. 1, typically employs differential amplifier 12 with transconductance components 14 and 16 (e.g., MOSFETs or similar type devices) that are responsive to input signals, e.g., $V_P$ and $V_N$, on input terminals 18 and 20, respectively. System 10 also includes current mirror circuit 22 that includes current reference device 24 (MN4) on input leg 28 and tail current device 26 (MN3) on output leg 30. A predetermined bias current, $I_{BIAS}$, is applied by current source device 31 to current reference device 24 that is mirrored to tail current device 26. If the voltage on output leg 30 of drain 32 is equal to the voltage on input leg 28 of drain 34, then the drain current of tail current device 26 will be equal to the drain current of current reference device 24. But, if the voltage on output leg 30 does not equal the voltage on input leg 28, the current in output leg 30 will not equal the current in input leg 28 resulting in a mirror error due to the finite output resistances associated with current reference device 24 and tail current device 26. Furthermore, the voltage on output leg 30 and drain 32 is a function of the input common mode voltage (e.g., $V_P/2+ V_N/2$). Thus, changes to the input common mode voltage cause proportional changes to the voltage on the output leg resulting in a mirror error which varies with the common mode of the input signal.

Figure 2:
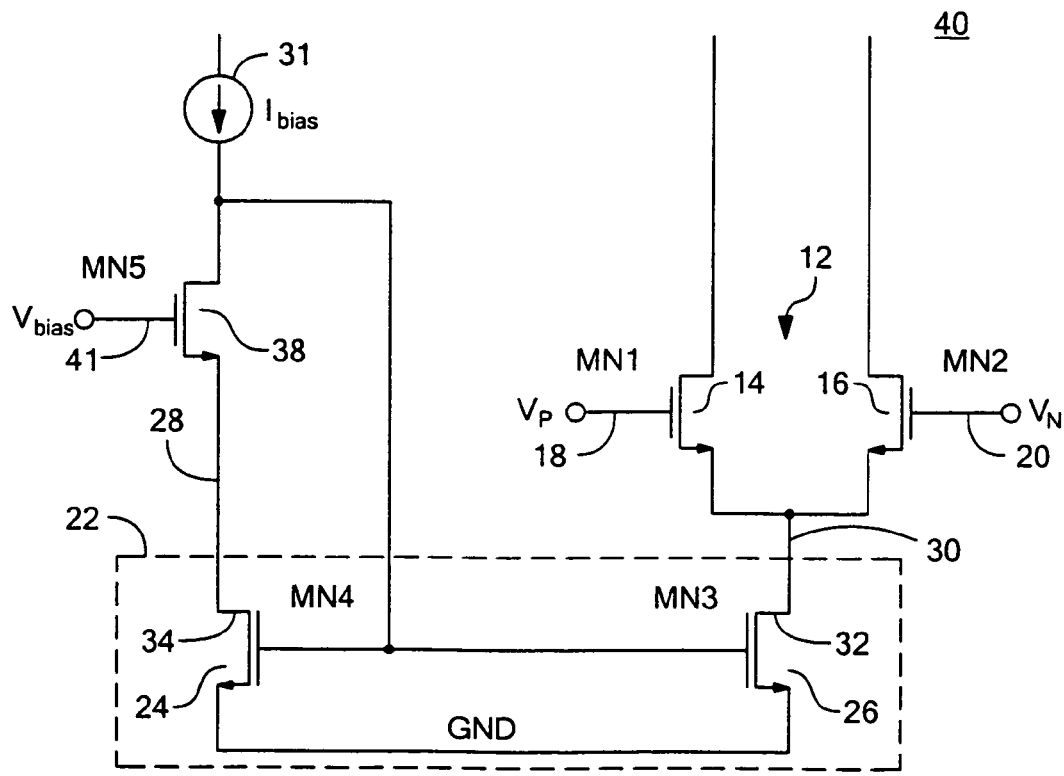
FIG. 2 is a circuit diagram of a typical prior art improved mirror bias system for a differential amplifier system.

An improved current mirror bias for a differential amplifier system 40, FIG. 2, where like parts have been given like numbers, similarly includes differential amplifier 12 with transconductance components 14 and 16 and input terminals 18 and 20 that are responsive to input signals (e.g., $V_P$ and $V_N$) and current mirror circuit 22 as described above. System 40 also includes cascode device 38, e.g., a MOSFET or similar type device, which is connected to current reference device 24. A fixed voltage, $V_{BIAS}$, is applied to gate 41 of cascode device 38. This sets the voltage on drain 34 of current reference device 24 to be equal to $V_{BIAS}-V_{GS}$. Cascode device 38 is typically sized to run at the same current density as transconductance components 14 and 16. When $V_{BIAS}$ is set equal to the input common mode voltage at input terminals 18 and 20, the voltage on drain 34 of current reference device 24 approximately matches the voltage on drain 32 of tail current device 26 and the effect of the finite impedance of current reference device 24 and tail current device 26 is cancelled and the current in input leg 28 approximately matches the current in output leg 30. The drawback of system 40 is that the biasing voltage, $V_{BIAS}$, is designed for a fixed predetermined input common mode voltage applied to input terminals 18 and 20 of differential amplifier 12. If the common mode voltage changes, or a large differential voltage is applied to input terminals 18 and 20, the voltage on drain 32 of tail current device 26 no longer matches the voltage on drain 34 of current reference device 24 and the currents in input leg 28 and output leg 30 no longer match.

Figure 3:
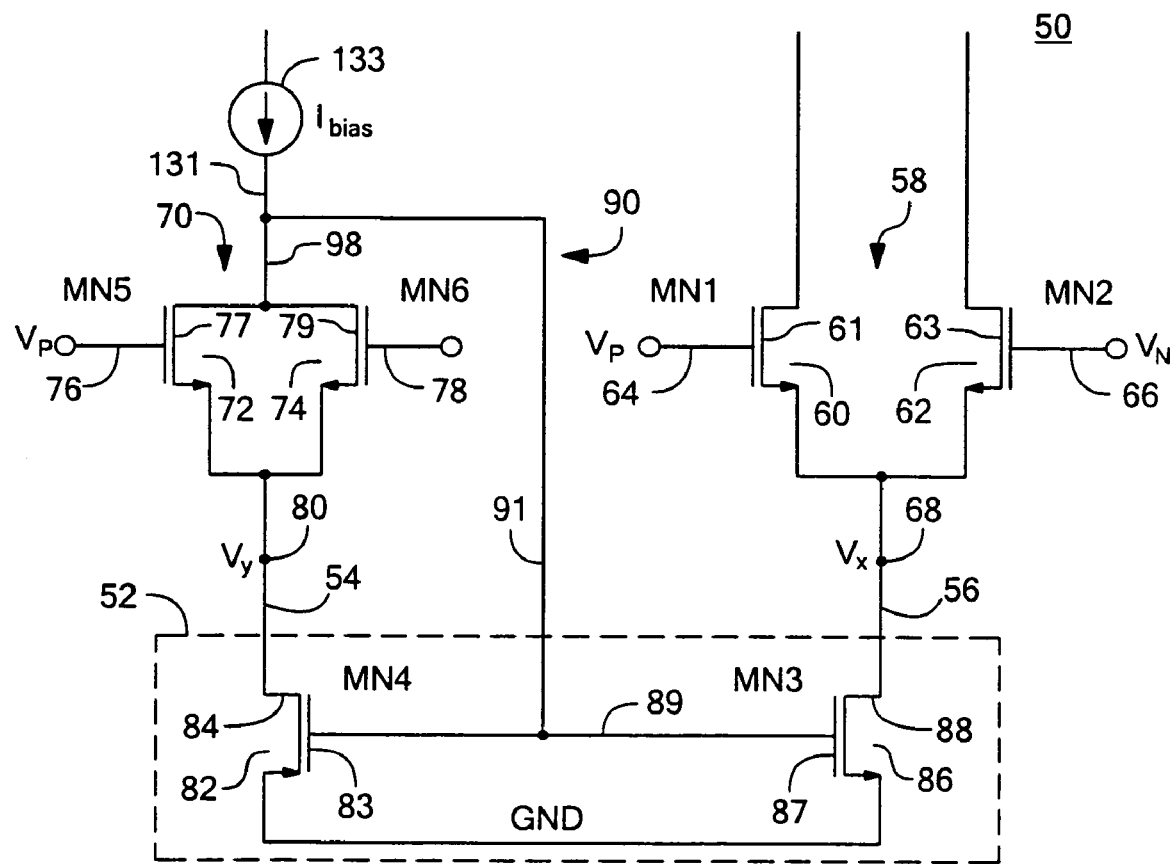
FIG. 3 is a circuit diagram of one embodiment of the input tracking current mirror for a differential amplifier system in accordance with the subject invention.

Input tracking current mirror for a differential amplifier system 50, FIG. 3, of this invention overcomes the problems associated with the prior art mirror bias systems discussed above by tracking the voltage at a common node on the input leg of the current mirror that is a function of the input signals with the voltage at a common node on the output leg that is a function of the same or equivalent input signals even when the common mode voltage changes or a differential change in voltage is applied at the input terminals.

System 50 includes current mirror 52 with input leg 54 and output leg 56. Current mirror 52 includes current reference device 82 and tail current device 86. Differential amplifier 58 includes at least two transconductance components, e.g., transconductance component 60 (MN1) and transconductance component 62 (MN2). Transconductance components 60 and 62 are typically MOSFETs, such as PMOS or NMOS type devices. In other designs, transconductance components 60 and 62 may be bipolar junction transistors (BJTs), such as PNP type or NPN type devices, field effect transistors (FETs) or similar type devices known to those skilled in the art. Transconductance components 60 and 62 each include at least one input terminal, e.g., input terminals 64 and 66, respectively, for receiving input signals $V_P$ and $V_N$, respectively. Transconductance components 60 and 62 include common node 68, $V_X$, connected to output leg 56 that has a voltage that is a function of input signals $V_P$ and $V_N$ applied at input terminals 64 and 66.

System 50 also includes tracking circuit 70 that includes at least two transconductance components, e.g., transconductance component 72 (MN5) and transconductance component 74 (MN6) that receive the same or equivalent input signals $V_P$ and $V_N$ on input terminals 76 and 78, respectively. Transconductance components 72 and 74 are typically of similar type as transconductance components 60 and 62 and may be sized to run at the same or different current densities as transconductance components 60 and 62. Transconductance components 72 and 74 include common node 80, $V_Y$, connected to input leg 54 that has a voltage that is also a function of the same or equivalent input signals $V_P$ and $V_N$.

When transconductance components 72 and 74 of tracking circuit 70 are sized to run at the same current density as transconductance components 60 and 62 of differential amplifier 58, tracking circuit 70 replicates the voltage at common node 68, $V_X$, on output leg 56 to the voltage at common node 80, $V_Y$ on input leg 54. The result is that the current in output leg 56 approximately matches the current in input leg 54 over a wide range of differential and/or common mode changes in the input signals $V_P$ and $V_N$. When transconductance components 72 and 74 are sized to run at different current density than transconductance components 60 and 62, tracking circuit 70 tracks the voltage at common node 68, $V_X$, on output leg 56 to the voltage at common node 80, $V_Y$, on input leg 54 so that the current in output leg 56 tracks the current on input leg 54.

In operation, the voltage at common node 80, $V_Y$, established by tracking circuit 70 that is a function of the input signals $V_P$ and $V_N$ applied at input terminals 76 and 78 sets the voltage on drain 84 of current reference device 82. The voltage at common node 68, $V_X$, established by differential amplifier 58, which is a function of the input signals $V_P$ and $V_N$ applied at input terminals 64 and 66, sets the voltage on drain 88 of tail current device 86. The voltage on drain 84 sets $V_{DS}$ of current reference device 82 and the voltage on drain 88 sets $V_{DS}$ of tail current device 86. When transconductance components 72 and 74 of tracking circuit 70 are sized to run at the same current density as transconductance components 60 and 62 of differential amplifier 58, tracking circuit 70 replicates the voltage from the output leg 56 to the input leg 54 so that the $V_{DS}$ of current reference device 82 is equal to the $V_{DS}$ of tail current device 86. Feedback loop 90 sets the $V_{GS}$ of current reference device 82 so that the current flow into drain 84 of current reference device 82 is equal to IBIAS on line 131 generated by current source 133. Gate 83 of current reference device 82 is connected to gate 87 of tail current device 86 by line 89. Thus, the $V_{GS}$ of current reference device 82 and the $V_{GS}$ of tail current device 86 are approximately equal. The result is the $V_D$, $V_{DS}$, and $V_{GS}$ of current reference device 82 and tail current device 86 will match. When current reference device 82 and tail current device 86 are also sized to run at the same current density, the errors due to finite output impedances of current reference device 82 and tail current device 86 are essentially cancelled and the current density in these devices will remain matched over a range of differential and/or common mode changes in the input voltages $V_P$ and $V_N$. The end result is that the current density in the input leg 54 and the current density in the output leg 56 remain approximately constant and matched over a range of differential and/or common mode changes in the input voltages $V_P$ and $V_N$.

Input leg 54 typically includes feedback loop 90 and transconductance components 72 and 74 of tracking circuit 70 are connected inside feedback loop 90. In this example, connection 91 of feedback loop 90 sets the drain voltages of tracking circuit 70 equal to the gate voltage of current reference device 82. Connection 91 of feedback loop 90 therefore determines the range of inputs over which system 50 effectively operates. To improve the input signal range, or headroom, of tracking circuit 70, a number of variations are possible as known to those skilled in the art, all of which increase the voltage at the drains of transconductance components 72 and 74 of tracking circuit 70 described above to provide for a wider range of input signals.

Figure 4:
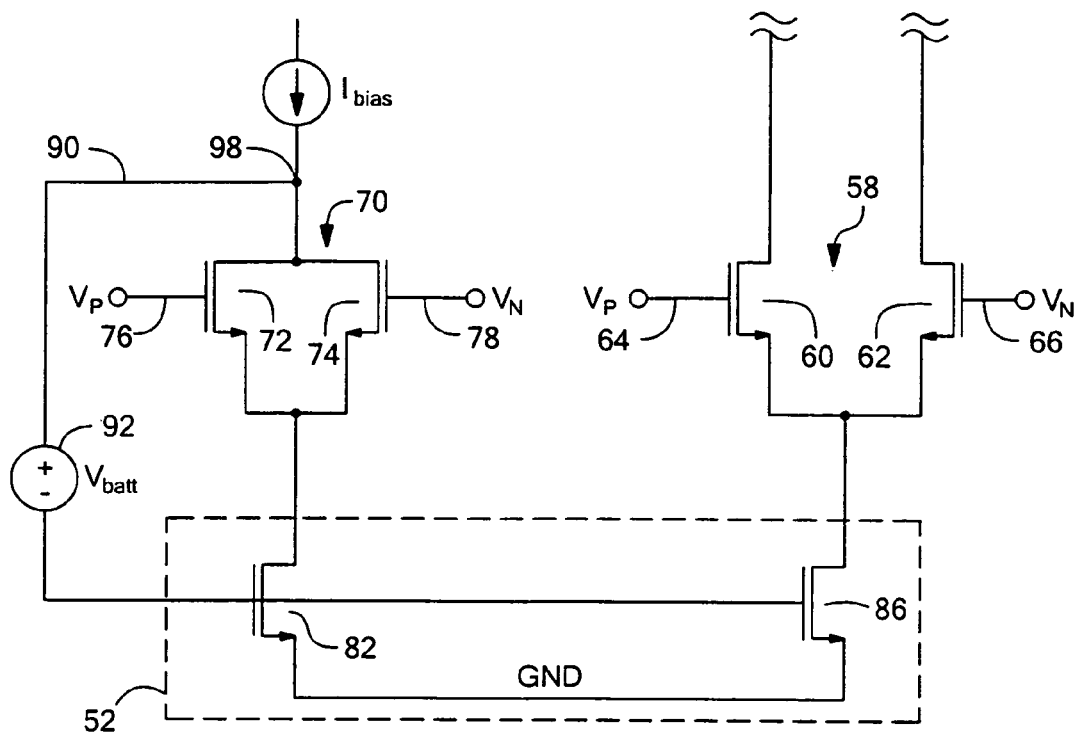
FIGS. 4-8 are a circuit diagrams of several embodiments showing various biasing devices used to boost the headroom of the tracking circuit connected inside the feedback loop of the input leg of the differential amplifier system of this invention shown in FIG. 3.
Figure 5:
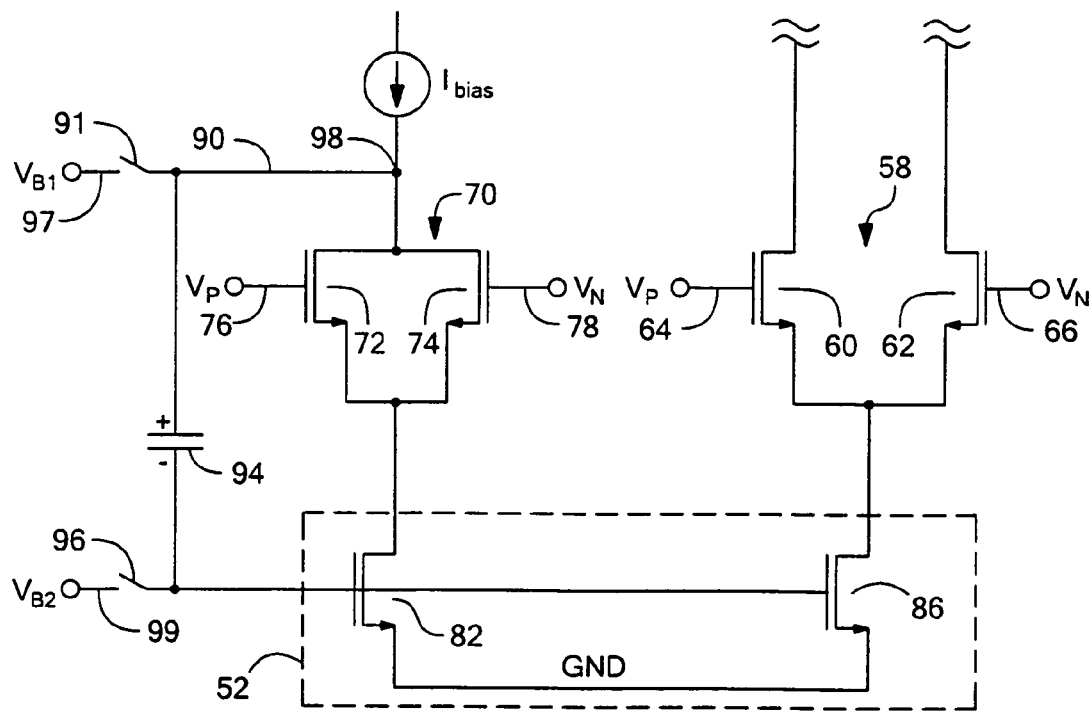
Figure 6:
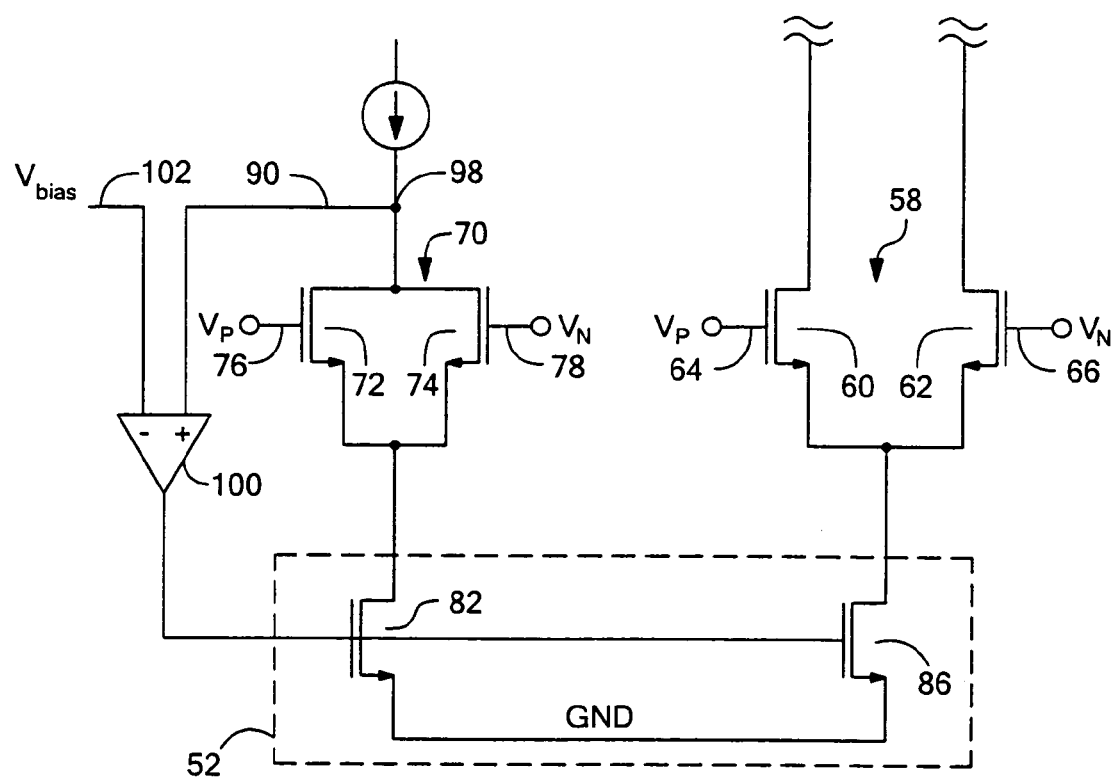
Figure 7:
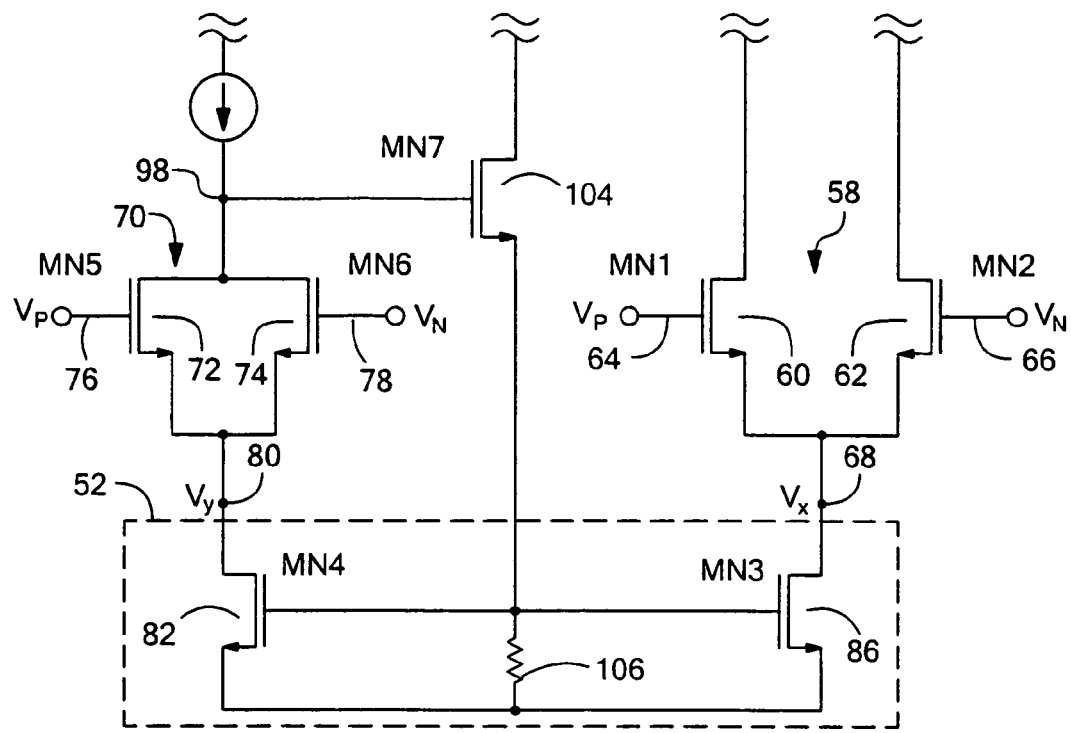
Figure 8:
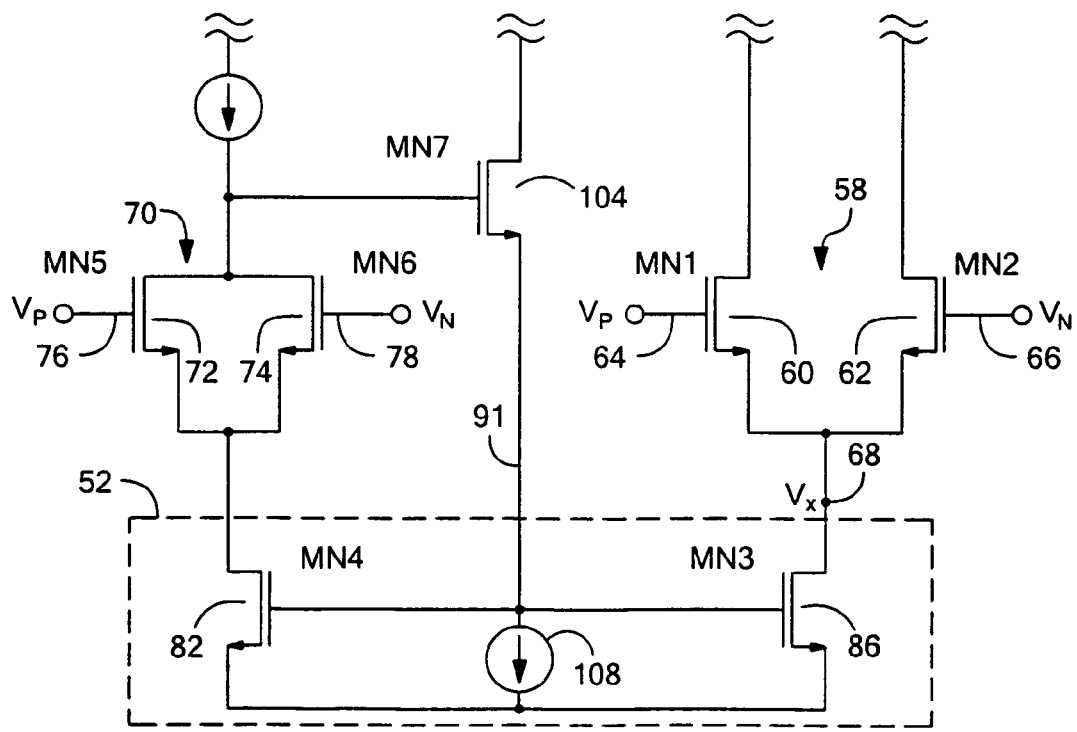

In one design, feedback loop 90 includes a bias device for boosting the headroom of tracking circuit 70. For example, as shown in FIG. 4, where like parts have been given like numbers, feedback loop 90 may include battery 92 for boosting the headroom of tracking circuit 70. In this example, battery 92 boosts the headroom of tracking circuit 70 by Vbatt, e.g., the voltage at node 98 is equal to the $V_{GS}$ of current reference device 82 plus Vbatt. In other examples, feedback loop 90, FIG. 5, includes switched capacitor 94 with switching devices 91 and 96 which act to boost the headroom of tracking circuit 70. In this example, the voltage at node 98 is increased by the voltage difference of $V_{B1}$–$V_{B2}$, indicated at 97 and 99, respectively. Operational amplifier 100, FIG. 6, may also be included in feedback loop 90 to set the voltage at node 98 of tracking circuit 70 equal to the voltage $V_{BIAS}$, indicated at 102. $V_{BIAS}$ can be set to any voltage as needed for various headroom requirements of tracking circuit 70. In other designs, feedback loop 90, FIG. 7, may include follower 104 that increases the headroom of tracking circuit 70 by the $V_{GS}$ of follower 104. Resistor 106 creates a bias current through follower 104. Feedback loop 90, FIG. 8, similarly includes follower 104 as discussed above, but uses current reference device 108 instead of resistor 106 for generating bias current through follower 104. Other examples for boosting the headroom of tracking circuit 70 will occur to those skilled in the art.

Figure 9:
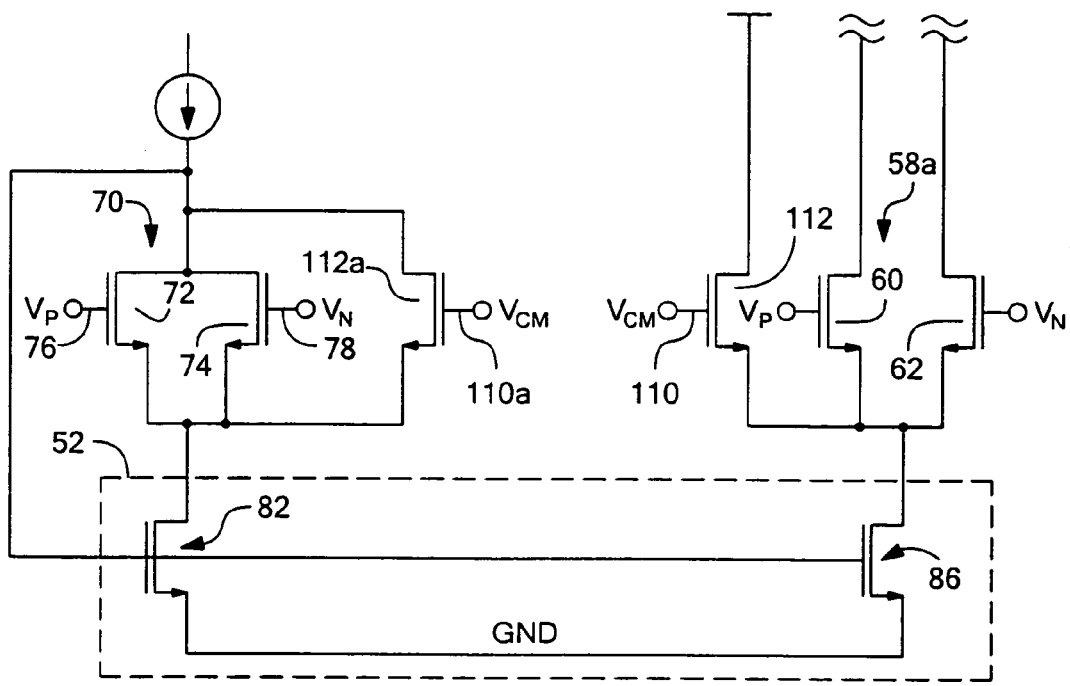
FIG. 9 is a circuit diagram of another embodiment of the tracking current mirror for a differential amplifier of this invention showing the differential amplifier and tracking circuit having a third input terminal and a third transconductance component for common mode biasing of the differential amplifier and tracking circuit.

Although as described above with reference to FIG. 3, differential amplifier 58 and tracking circuit 70 each include two input terminals and two transconductance components, this is not a necessary limitation of this invention, as differential amplifier 58 and tracking circuit 70 may each also include at least a third input terminal and at least a third transconductance component. For example, differential amplifier 58a, FIG. 9, may include a third transconductance component 112 with input terminal 110 connected to a voltage $V_{CM}$ for common mode biasing the differential amplifier 58 as known by those skilled in the art. Similarly, tracking circuit 70 may also include a third transconductance component 112a with third input terminal 110a that is connected to the same voltage $V_{CM}$ for biasing tracking circuit 70. In other examples, differential amplifier 58b, FIG. 10, may include at least a third component, e.g., diode connected transistor 113, for tracking the common mode voltage for the input signals $V_P$ and $V_N$ of differential amplifier 58. In other designs third component 113 may be a resistor, a battery or a capacitor. Similarly, as described above, tracking circuit 70 may include at least a third component, e.g. diode connected transistor 113a, which is typically sized to run at the same current density as diode connected transistor 113.

Figure 11:
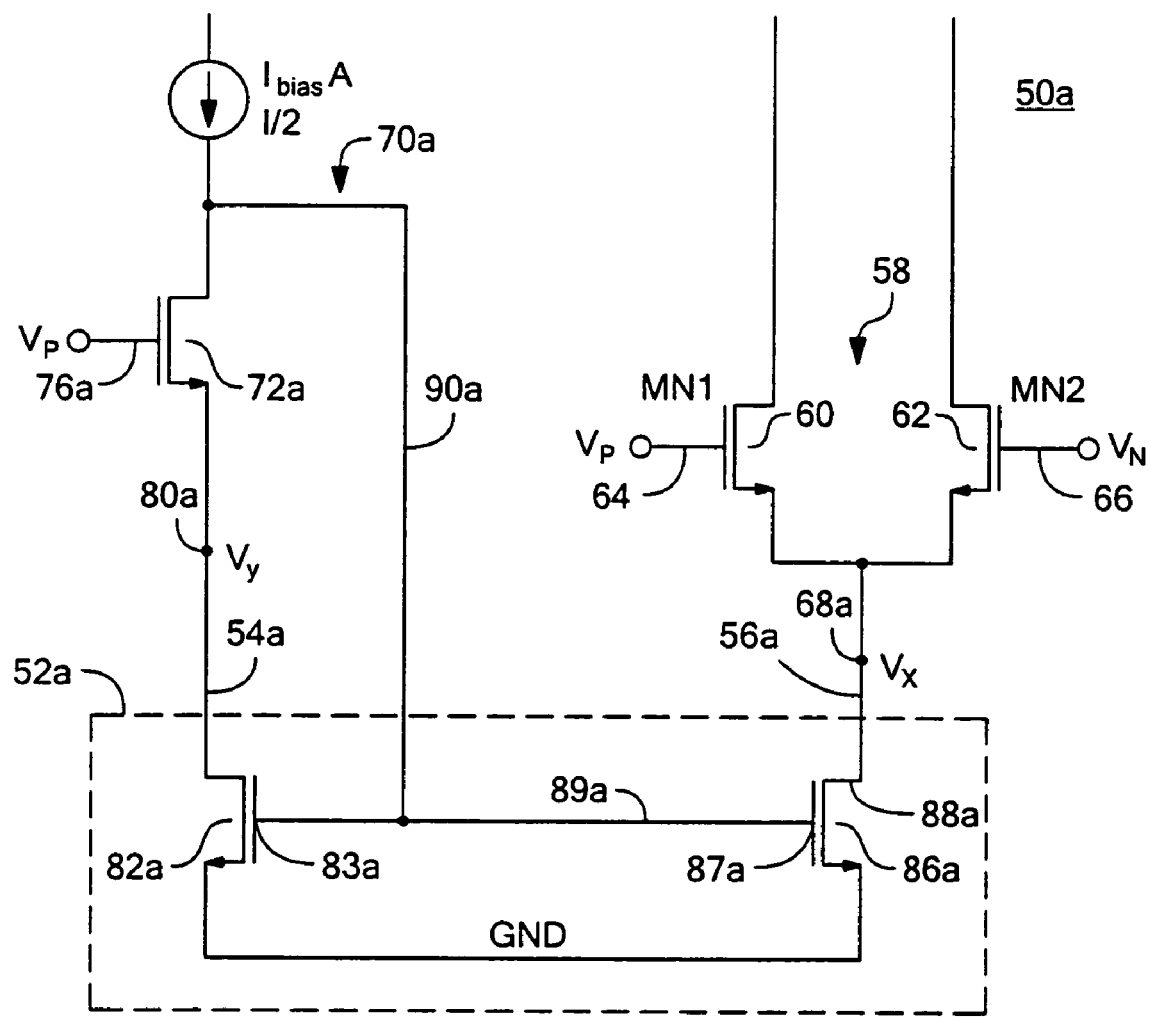
FIG. 11 is a circuit diagram of another embodiment of the input tracking current mirror for a differential amplifier of this invention that includes one tracking circuit with one transconductance component.

Input tracking current mirror for a differential amplifier system 50a, FIG. 11, of this invention where like parts have been given like numbers, includes current mirror 52a as described above with input leg 54a and output leg 56a, current reference device 82a and tail current device 86a. System 50a also includes differential amplifier 58 as described above that includes transconductance components 60 and 62 each having at least one input terminal e.g., a input terminal 64 and 66 for receiving input signals $V_P$ and $V_N$, respectively and a common node 68a, $V_X$, connected to output leg 56a that has a voltage that is a function of the input signals $V_P$ and $V_N$ applied at input terminals 64 and 66. In this embodiment, system 50a includes first tracking circuit 70a that includes at least one transconductance component 72a with at least one input terminal 76a that receives one of the input signals $V_P$ and $V_N$ that are applied to differential amplifier 58, e.g., input signal $V_P$ on input terminal 76a. Transconductance component 70a includes a second node 80a, $V_Y$, connected to input leg 54a that has a voltage that is a function of the input signal $V_P$ applied at input terminal 76a. Tracking circuit 70a drives the voltage at node 80a, $V_Y$, on input leg 54a to track the voltage at node 68a, $V_X$, on output leg 56a. Preferably, the voltage $V_P$ is approximately equal to the voltage $V_N$ and therefore the voltage at node 80a, $V_Y$, tracks the voltage at node $V_X$. This is often the case if the differential pair is used as the input of a high gain operational amplifier connected in negative feedback.

Figure 12:
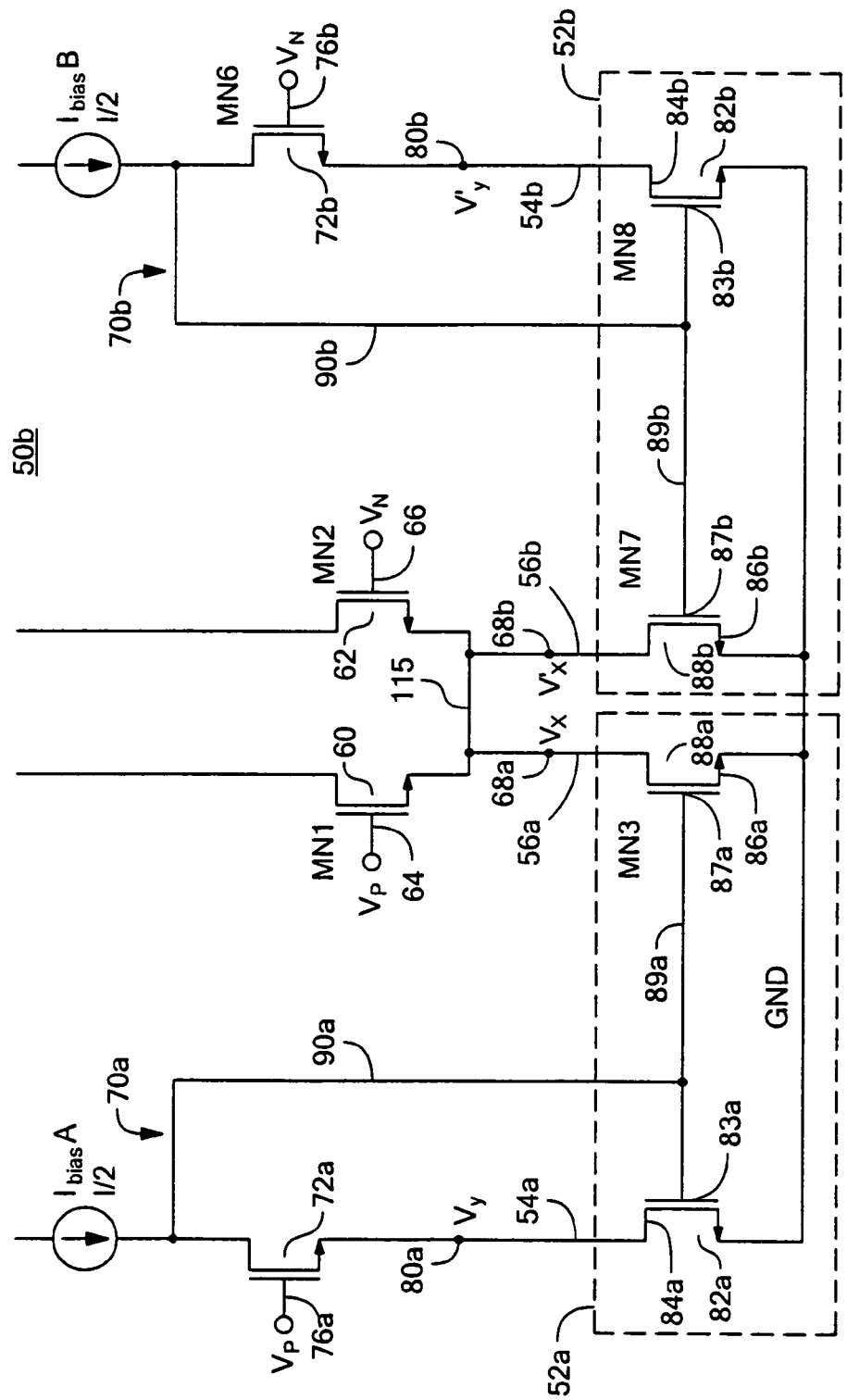
FIG. 12 is a circuit diagram of the input tracking current mirror for a differential amplifier system shown in FIG. 11 that includes two tracking circuits and two current mirror circuits.

Input tracking current mirror for a differential amplifier system 50b, FIG. 12, where like parts have been given like numbers, includes second tracking circuit 70b and second current mirror 52b that includes input leg 54b and output leg 56b wherein output leg 56b of current mirror 52b is interconnected to output leg 56a of current mirror 52a by output leg common node 115. Second tracking circuit 70b includes at least one transconductance component 72b having at least one input terminal 76b that receives the other of the input signals $V_P$ and $V_N$, e.g., input signal $V_N$ applied to input terminal 76b. Transconductance component 72b includes node 80b, $V_Y'$, connected to input leg 54b of second current mirror 52b that is a function of the input signal $V_N$ applied at input terminal 76b. Tracking circuits 70a and 70b together drive the average of the voltage at node 80a ($V_Y$) and the voltage at node 80b $V_{Y'}$) on input legs 54a and 54b, respectively, of current mirrors 52a and 52b to track to the voltage on output leg common node 115. Tracking circuits 70a and 70b also drive the sum of the currents in output legs 56a and 56b to be constant and approximately equal to the sum of the currents in input legs 54a and 54b, even with differential variations in input signals $V_P$ and $V_N$ and/or with changes in the common mode voltage $V_P$ and $V_N$.

For example, for a fully differential input, if $V_P$ applied at input terminal 76a is increased by $+\Delta V$, the voltage at node 80a, $V_Y$, and the voltage at the drain 84a of the current reference device 82a also increases by $+\Delta V$ which in turn causes an error current of $+\Delta i$ to flow in transconductance device 72a due to the finite output impedance associated with current reference device 82a. The current error is sensed by negative feedback loop 90a which operates to lower the $V_{GS}$ of current reference device 82a until the error current is approximately equal to zero. In this example, the input ($V_P$–$V_N$) is fully differential therefore the voltage, $V_X$, does not change. But, the $V_{GS}$ of tail current device 86a is decreased due to the operation of the tracking circuit 72a, which results in the drain current of tail current device 86a decreasing $-\Delta i$.

For a fully differential input, $V_N$ is decreased by $\Delta V$. Tracking circuit 70b operates similarly to tracking circuit 70a, but in the opposite direction. The end result is that the drain current in tail current device 86b is increased by $+\Delta i$. The total tail current is therefore the sum of the currents in tail current devices 86a and 86b. Since the current in one tail current device is increased by $+\Delta i$ while the current in other tail current device is decreased by $-\Delta i$, the error currents cancel and the net tail current into differential pair 62 and 60 remains constant and approximately equal to the sum of the currents in input legs 54a and 54b for differential changes to the input signals $V_P$, $V_N$. For common mode variations in $V_P$ and $V_N$, nodes $V_Y$, $V_Y'$, $V_X$ and $V_X'$ will all vary equally, thus the net tail current, which is the sum of the currents flowing in tail current devices 86a and 86b will be approximately equal to the sum of the currents into the input legs 54a and 54b for common mode changes in the input signals $V_P$, $V_N$.

Figure 13:
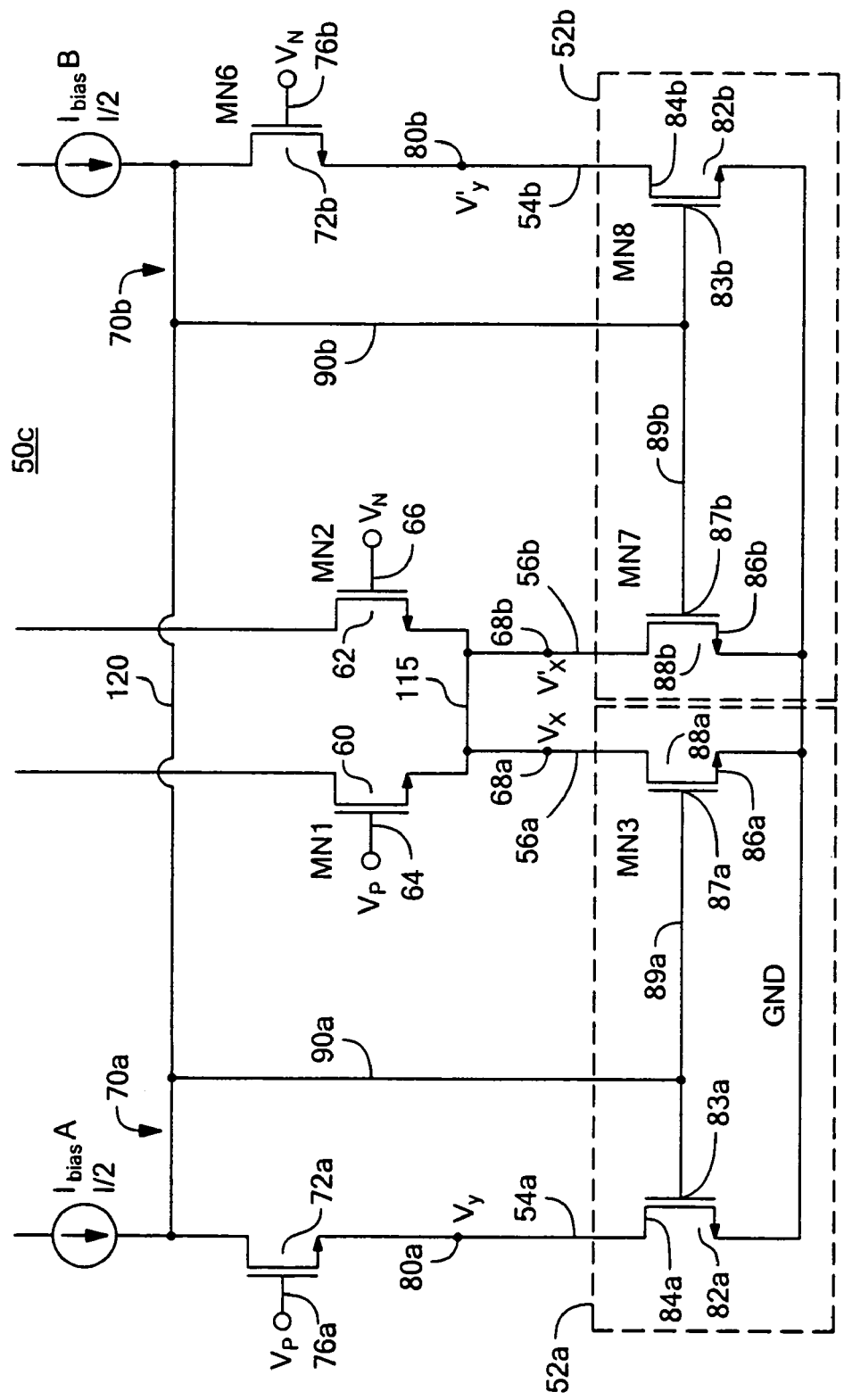
FIG. 13 is a circuit diagram of yet another embodiment of the input tracking current mirror for a differential amplifier system shown in FIG. 12 in which the feedback loops of the two current mirrors are interconnected.

Input tracking current mirror for a differential amplifier system 50c, FIG. 13, where like parts have been given like numbers, is of similar design as system 50b except feedback loop 90a of current mirror 52a is shorted to feedback loop 90b of current mirror 52b, as shown by lead 120. System 50c operates similar to system 50b described above and drives the average of the voltage at node 80a ($V_Y$) and the voltage at node 80b ($V_{Y'}$) on input legs 54a and 54b, respectively, of current mirrors 52a and 52b to track to the voltage on output leg common node 115 and drives the sum of the currents in output legs 56a and 56b to be constant and approximately equal to the sum of the currents in input legs 54a and 54b, even with changes in the common mode voltage $V_P$ and $V_N$ and/or with differential variations in input signals $V_P$ and $V_N$.

Figure 14:
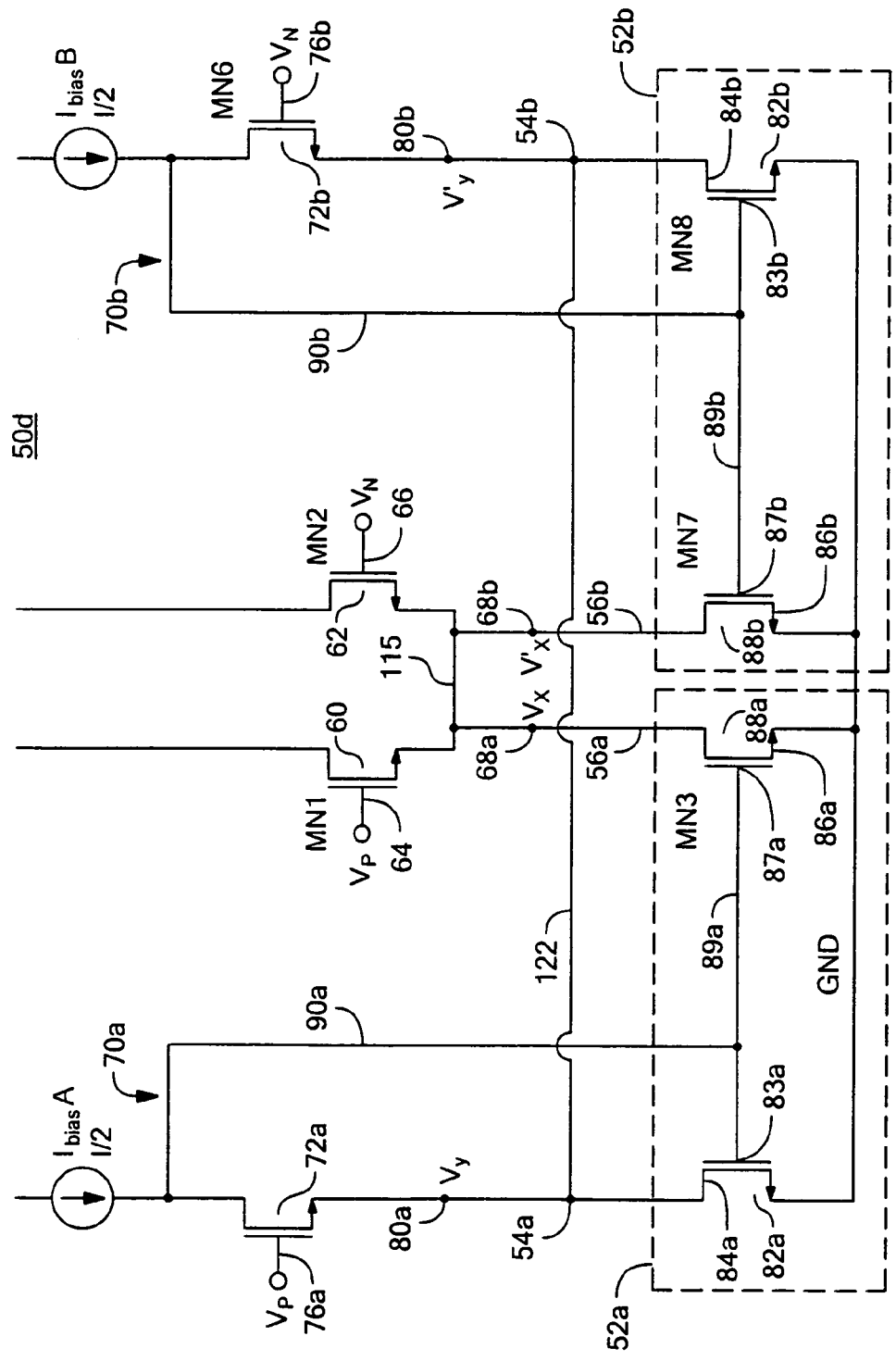
FIG. 14 is a circuit diagram of another embodiment of the input tracking current mirror for a differential amplifier system shown in FIG. 12 in which the input legs of the two current mirrors are interconnected.
Figure 3:
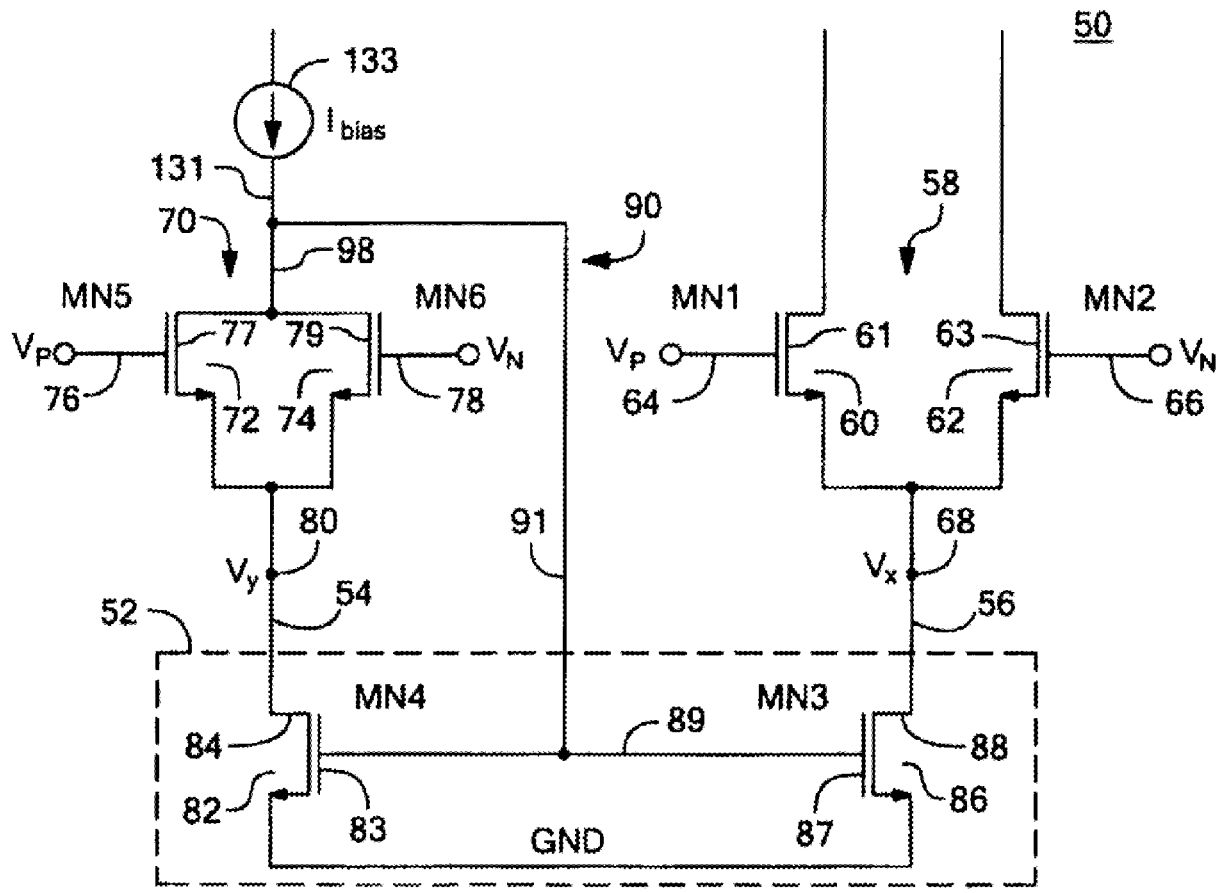
Figure 9:
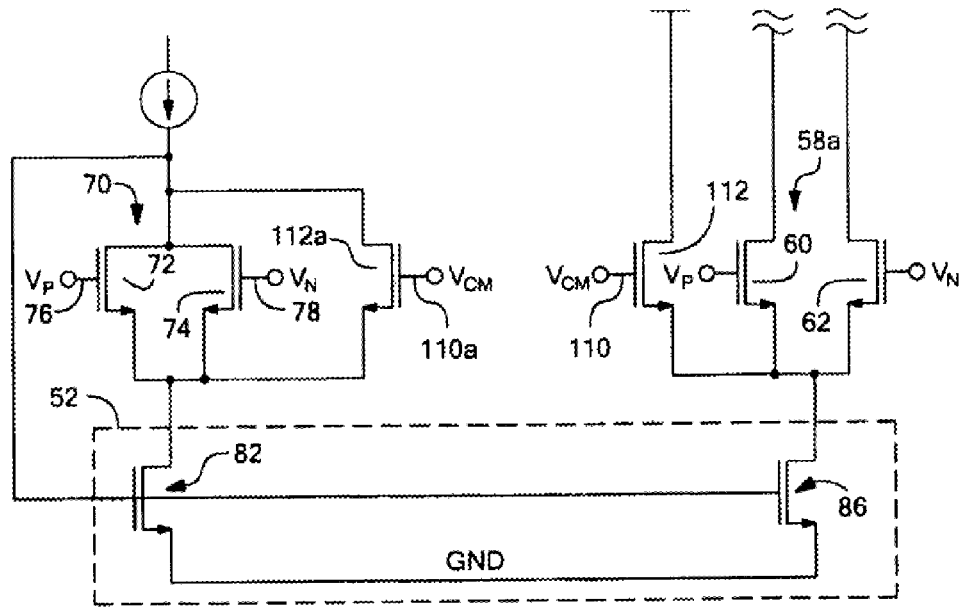
Figure 10:
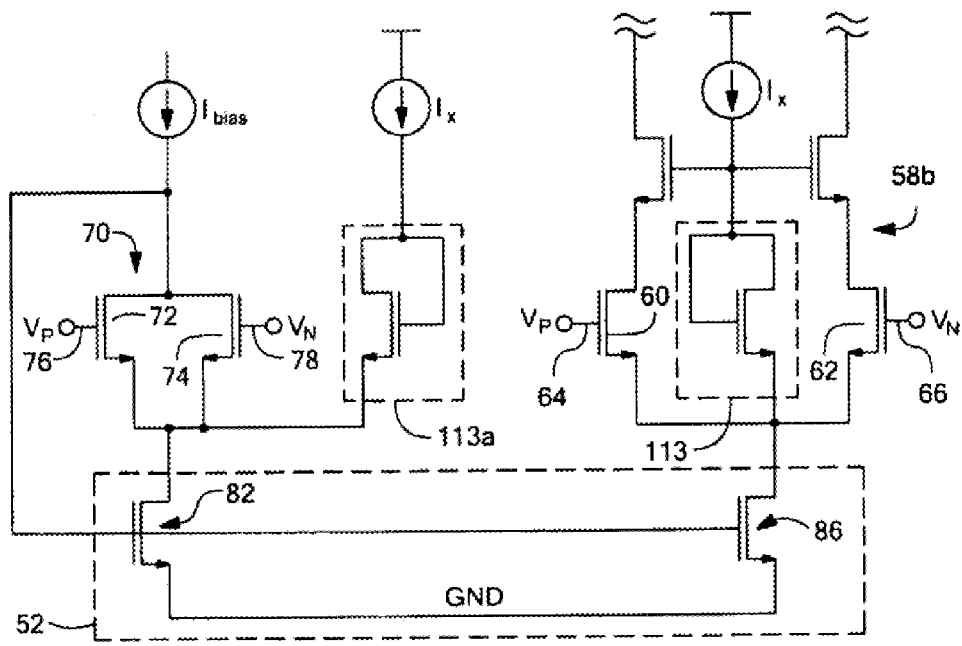

Input tracking current mirror for a differential amplifier system 50d, FIG. 14, where like parts have been given like numbers, is of similar design as system 50b except input leg 54a of current mirror 52a is connected to the input leg 54b of current mirror 54b by lead 122. System 50d operates similar to system 50b described above.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

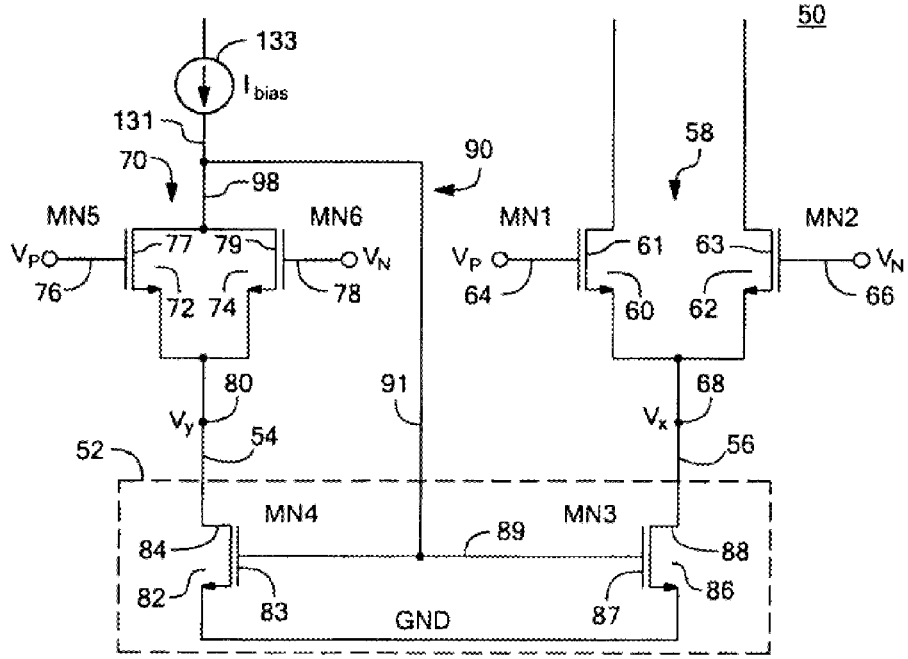

What is claimed is:

1. An input tracking current mirror for a differential amplifier system comprising:
   a current mirror having an input leg and an output leg;
   a differential amplifier including a first set of at least two transconductance components each having at least one input terminal for receiving input signals, said first set of at least two transconductance components having a first common node connected to said output leg having a first voltage that is a function of said input signals; and
   a tracking circuit including a second set of at least two transconductance components each having at least one input terminal for receiving said input signals, said second set of at least two transconductance components having a second common node connected to said input leg having a second voltage that is a function of said input signals, said tracking circuit driving said second voltage on said input leg to track said first voltage on said output leg with variations in said input signals.

2. The system of claim 1 in which said first and second sets of at least two transconductance components each include a transconductance device chosen from the group consisting of: a MOSFET, a bipolar junction transistor, and a JFET.

3. The system of claim 2 in which said MOSFET includes a PMOS type device or an NMOS type device.

4. The system of claim 2 in which said bipolar junction transistor includes a PNP type device or an NPN type device.

5. The system of claim 1 in which said input leg includes a feedback loop and said second set of at least two transconductance components of said tracking circuit are connected inside said feedback loop.

6. The system of claim 5 in which said feedback loop includes a biasing device for boosting the headroom of said tracking circuit.

7. The system of claim 6 in which said biasing device includes a biasing device chosen from the group consisting of: a battery, a switched capacitor, an operational amplifier, a buffer, and a follower for boosting the headroom of said tracking circuit.

8. The system of claim 1 in which said first and second sets of at least two input terminals further include at least a third input terminal for receiving at least a third input signal.

9. The system of claim 8 in which said first and second sets of at least two transconductance components each further include at least a third transconductance component for common mode biasing said differential pair and said tracking circuit.

10. The system of claim 8 in which said first and second sets of transconductance components each further include a component for tracking the common mode voltage of said input signals of said differential amplifier and said tracking circuit.

11. The system of claim 10 in which said component is a component chosen from the group consisting of: a diode connected transistor, a resistor, and a current source.

12. An input tracking current mirror system for a differential amplifier system comprising:
   a first current mirror circuit having an input leg and an output leg;
   a differential amplifier including a first set of at least two transconductance components each having at least one input terminal for receiving input signals, said first set of at least two transconductance components having a first common node connected to said output leg having a first voltage that is a function of said input signals; and
   a first tracking circuit including at least one first transconductance component having at least one input terminal for receiving one of said input signals, said at least one first transconductance component having a second node connected to said input leg having a second voltage that is a function of said one of said input signals, said first tracking circuit driving said second voltage on said input leg to track said first voltage on said output leg.

13. The system of claim 12 further including a second tracking circuit and a second current mirror circuit including an input leg and an output leg wherein the output leg of said second current mirror circuit is connected to the output leg of said first current mirror circuit by an output leg common node.

14. The system of claim 13 in which said second tracking circuit includes at least one second transconductance component having at least one input terminal for receiving the other of said input signals and having a third node connected to the input leg of said second current mirror circuit having a third voltage that is a function of said other of said input signals, said first and second tracking circuits driving the average of said second and third voltages on said input legs of said first and second current mirror circuits to track the voltage on said output leg common node.

15. The system of claim 14 in which the sum of the current densities in the output legs is constant and approximately equal to the sum of the current densities in the input legs.

16. The system of claim 14 in which said input leg of said first current mirror includes a feedback loop and said at least one first transconductance component is connected inside said feedback loop.

17. The system of claim 14 in which said input leg of said second current mirror includes a feedback loop and said at least one second transconductance component is connected inside said feedback loop.

18. The system of claim 17 in which said feedback loop of said first current mirror is shorted to the feedback loop of said second current mirror.

19. The system of claim 13 in which said input leg of said first current mirror is shorted to the input leg of said second current mirror.

* * * * *

UNITED STATES PATENT AND TRADEMARK OFFICE
CERTIFICATE OF CORRECTION

PATENT NO. : 7,250,819 B2
APPLICATION NO. : 11/304326
DATED : July 31, 2007
INVENTOR(S) : Kelly et al.

It is certified that error appears in the above-identified patent and that said Letters Patent is hereby corrected as shown below:

The title page showing the illustrative figure should be deleted to be replaced with the attached title page.

Figure 10:
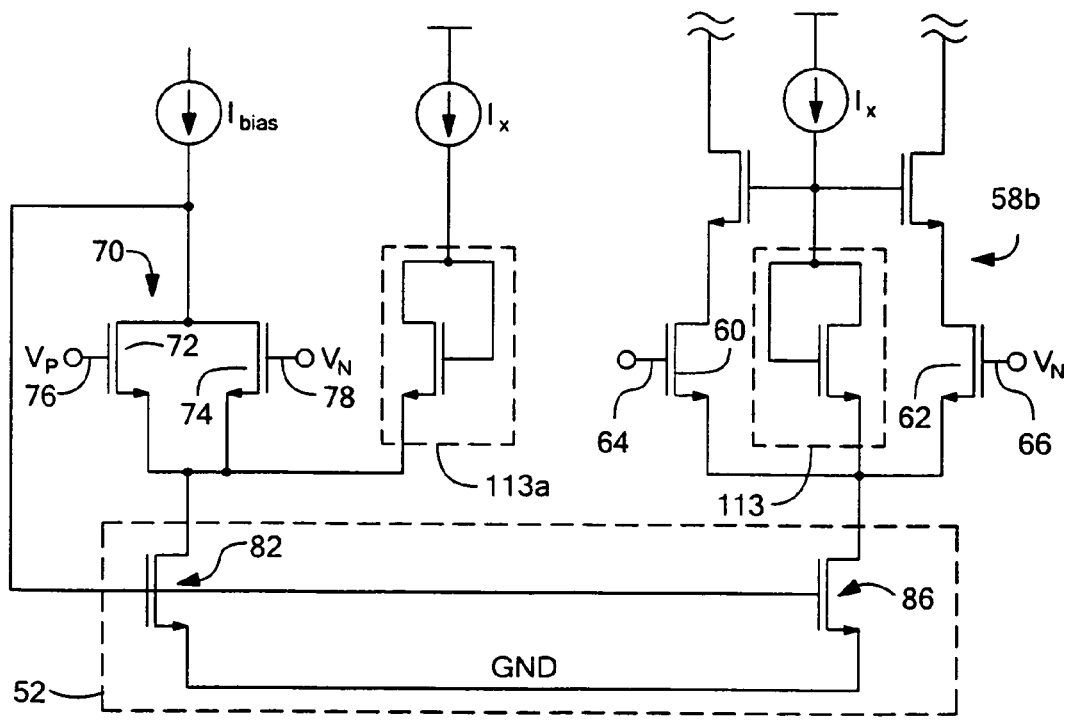
FIG. 10 is a circuit diagram of yet another embodiment of the tracking current mirror for a differential amplifier of this invention showing the differential amplifier and tracking circuit with a third input terminal and a third component for tracking the common mode voltage of the input signals.

The drawing sheets, consisting of Figs. 3 and 10, should be deleted to be replaced with the drawing sheets, consisting of Figs. 3 and 10, as shown on the attached page.

In the drawing: Fig. 3 on sheet 2 of 10 of the drawings should indicate "$V_N$" to the right side of the terminal indicated by reference number 78.

The arrow between reference numbers 82 and 83 should point to the left.

In the drawing: Fig. 10 on sheet 6 of 10 should indicate "$V_P$" to the left side of the terminal indicated by reference number 64.

Reference number 54b in line 22 of Column 9 should be changed to 52b.

Signed and Sealed this

Twelfth Day of May, 2009

JOHN DOLL
*Acting Director of the United States Patent and Trademark Office*

(12) United States Patent
Kelly et al.

(10) Patent No.: US 7,250,819 B2
(45) Date of Patent: Jul. 31, 2007

(54) INPUT TRACKING CURRENT MIRROR FOR A DIFFERENTIAL AMPLIFIER SYSTEM

(75) Inventors: Daniel F. Kelly, Andover, MA (US); Lawrence A. Singer, Burlington, MA (US)

(73) Assignee: Analog Devices, Inc., Norwood, MA (US)

(*) Notice: Subject to any disclaimer, the term of this patent is extended or adjusted under 35 U.S.C. 154(b) by 106 days.

(21) Appl. No.: 11/304,326

(22) Filed: Dec. 15, 2005

(65) Prior Publication Data
US 2006/0132239 A1 Jun. 22, 2006

Related U.S. Application Data

(60) Provisional application No. 60/636,725, filed on Dec. 16, 2004.

(51) Int. Cl.
*H03F 3/45* (2006.01)
(52) U.S. Cl. .................. 330/257; 330/258; 330/260
(58) Field of Classification Search .............. 330/257, 330/258, 260
See application file for complete search history.

(56) References Cited

U.S. PATENT DOCUMENTS

| | | | |
|---|---|---|---|
| 5,714,906 A * | 2/1998 | Motamed et al. | 327/563 |
| 6,891,433 B2 * | 5/2005 | Schrader | 330/253 |
| 7,042,289 B2 * | 5/2006 | Hwang et al. | 330/253 |
| 7,049,889 B2 * | 5/2006 | Kalb | 330/253 |

* cited by examiner

*Primary Examiner*—Patricia Nguyen
(74) *Attorney, Agent, or Firm*—Iandiorio & Teska

(57) ABSTRACT

An input tracking current mirror for a differential amplifier system includes a current mirror having an input leg and an output leg, a differential amplifier including a first set of at least two transconductance components, each having at least one input terminal for receiving input signals, the first set of at least two transconductance components having a first common node connected to the output leg which has a first voltage that is a function of the input signals, and a tracking circuit including a second set of at least two transconductance components each having at least one input terminal for receiving the input signals, the second set of at least two transconductance components, having a second common node connected to the input leg which has a second voltage that is a function of the input signals, the tracking circuit driving the second voltage on the input leg to track the first voltage on the output leg with variations in the input signals.

19 Claims, 10 Drawing Sheets